(12) United States Patent
Yaegashi

(10) Patent No.: US 9,653,293 B2
(45) Date of Patent: May 16, 2017

(54) SEMICONDUCTOR DEVICE MANUFACTURING METHOD AND SEMICONDUCTOR DEVICE MANUFACTURING APPARATUS

(71) Applicant: TOKYO ELECTRON LIMITED, Tokyo (JP)

(72) Inventor: Hidetami Yaegashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/619,554

(22) Filed: Feb. 11, 2015

(65) Prior Publication Data

US 2015/0227047 A1   Aug. 13, 2015

(30) Foreign Application Priority Data

Feb. 13, 2014  (JP) ................. 2014-025637

(51) Int. Cl.
| | | |
|---|---|---|
| G03F 7/20 | (2006.01) | |
| H01L 21/027 | (2006.01) | |
| H01L 21/67 | (2006.01) | |
| H01L 21/311 | (2006.01) | |

(52) U.S. Cl.
CPC ........ *H01L 21/0274* (2013.01); *G03F 7/2024* (2013.01); *H01L 21/31144* (2013.01); *H01L 21/67178* (2013.01); *H01L 21/67225* (2013.01)

(58) Field of Classification Search
CPC . G03F 7/26; G03F 7/20; G03F 7/2002; G03F 7/2022; G03F 7/2024
See application file for complete search history.

(56) References Cited

U.S. PATENT DOCUMENTS

2014/0080069 A1*  3/2014  Yang ................ G03F 7/0035
                                                          430/326

FOREIGN PATENT DOCUMENTS

| JP | 2002-208557 A | 7/2002 |
|---|---|---|
| JP | 2004-179221 A | 6/2004 |
| JP | 2008-292975 A | 12/2008 |
| JP | 2009-288344 A | 12/2009 |
| JP | 2010-244041 A | 10/2010 |
| JP | 2015-82046 A | 4/2015 |

* cited by examiner

*Primary Examiner* — Kathleen Duda
(74) *Attorney, Agent, or Firm* — Rothwell, Figg, Ernst & Manbeck, P.C.

(57) ABSTRACT

A manufacturing a semiconductor device of the present disclosure includes coating a photosensitive material on a workpiece; exposing the photosensitive material using a first exposure mask; performing a positive-tone development on the photosensitive material using a first developer after the first exposing; exposing the photosensitive material using a second exposure mask after the first developing; and performing a negative-tone development on the photosensitive material using a second developer after the second exposing.

7 Claims, 15 Drawing Sheets

SEMICONDUCTOR DEVICE MANUFACTURING METHOD AND SEMICONDUCTOR DEVICE MANUFACTURING APPARATUS

CROSS-REFERENCE TO RELATED APPLICATIONS

This application is based on and claims priority from Japanese Patent Application No. 2014-025637, filed on Feb. 13, 2014, with the Japan Patent Office, the disclosure of which is incorporated herein in its entirety by reference.

TECHNICAL FIELD

The present disclosure relates to a semiconductor device manufacturing method and a semiconductor manufacturing apparatus.

BACKGROUND

With high integration of semiconductor devices, a process technique of more finely processing semiconductor devices is requested. As a technique of finely processing semiconductor devices, a pattern forming method has been generally used, in which a resist pattern is formed using a photolithography technique and the formed resist pattern is used as an etching mask to etch a workpiece.

It has been recently requested that semiconductor devices be miniaturized to a resolution limit or smaller of an exposure device in the photolithography technique.

As a technique of forming a finer pattern than the resolution limit of an exposure device by the photography technique, a double patterning technique such as a lithography-etching-lithography-etching (LELE) method is known (e.g., see Japanese Laid-Open Patent Publication No. 2009-288344).

SUMMARY

The present disclosure provides a semiconductor device manufacturing method including: coating a photosensitive material on a workpiece; exposing the photosensitive material using a first exposure mask; performing a positive-tone development on the photosensitive material using a first developer after the first exposing; exposing the photosensitive material using a second exposure mask after the first developing; and performing a negative-tone development on the photosensitive material using a second developer after the second exposing.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
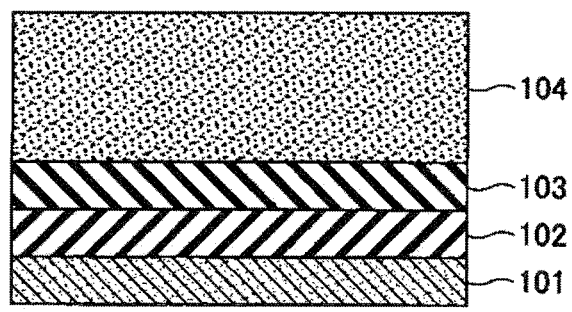
FIGS. 1A to 1C are cross-sectional views illustrating steps of an exemplary semiconductor device manufacturing method according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

According to the double patterning technique by the LELE method, a lithography process which forms a pattern by a coating process, an exposing process, and a developing process and an etching process which performs etching based on the pattern obtained in the lithography process need to be alternately and repeatedly performed. Therefore, the number of entire processes is increased, which increases manufacturing costs.

Accordingly, an object of the present disclosure is to provide a semiconductor device manufacturing method in which a desired fine pattern is obtained with a reduced number of processes as compared with the LELE process.

According to an aspect, the present disclosure provides a semiconductor device manufacturing method, including coating a photosensitive material on a workpiece; exposing the photosensitive material using a first exposure mask;

performing a positive-tone development on the photosensitive material using a first developer after the first exposing; exposing the photosensitive material using a second exposure mask after the first developing; and performing a negative-tone development on the photosensitive material using a second developer after the second exposing.

In the above-mentioned method, when the first exposure mask and the second exposure mask are superimposed one on another, an opening formed on the first exposure mask and a light shielding part formed on the second exposure mask are spaced apart from each other at different positions when viewed from the top.

In the above-mentioned method, the first exposing includes aligning a position of the workpiece and a position of the first exposure mask based on an alignment mark formed on the workpiece. The second exposing step includes aligning a position of the workpiece and a position of the second exposure mask based on the alignment mark formed on the workpiece.

In the above-mentioned method, a pattern formed by the method includes a hole pattern or a trench pattern.

In the above-mentioned method, the photosensitive material includes a polarity-changeable resist.

In the above-mentioned method, a developed region formed by the method includes a portion where a distance between centers of adjacent developed regions is less than 76 nm.

According to another aspect, the present disclosure provides a semiconductor manufacturing apparatus, including a photosensitive material coating unit configured to coat a photosensitive material on an workpiece; a first exposing unit configured to expose the photosensitive material using a first exposure mask; a first developing unit configured to perform a positive-tone development on the photosensitive material using a first developer; a second exposing unit configured to expose the photosensitive material using a second exposure mask; a second developing unit configured to perform a negative-tone development on the photosensitive material using a second developer; a conveying unit configured to carry in and out the workpiece among the photosensitive material coating unit, the first exposing unit, the first developing unit, the second exposing unit, and the second developing unit; and a control unit configured to controls the conveying unit and the second exposing unit to convey the workpiece which is carried out of the first developing unit to the second exposing unit so as to further expose the photosensitive material remaining in the first developing unit.

According to an exemplary embodiment, a semiconductor device manufacturing method in which a desired fine pattern is obtained with a reduced number of steps as compared with the LELE process may be provided.

First Exemplary Embodiment

First, a semiconductor device manufacturing method according to a first embodiment of the present disclosure will be described.

The semiconductor device manufacturing method according to the first embodiment includes coating a photosensitive material on a workpiece; exposing the photosensitive material using a first exposure mask; performing a positive-tone development on the photosensitive material using a first developer after the first exposing; exposing the photosensitive material using a second exposure mask after the first developing; and performing a negative-tone development on the photosensitive material using a second developer after the second exposing.

Hereinafter, the respective steps will be described in detail with reference to FIGS. 1A to 6C. FIGS. 1A to 3C are cross-sectional views illustrating steps an exemplary semiconductor device manufacturing method according to a first exemplary embodiment.

In FIGS. 1A to 3C, as a workpiece, one processing target layer 102 and one hard mask layer 103 formed on a substrate 101 are used, but the present disclosure is not limited thereto. For example, the workpiece may have a structure in which one processing target layer 102 or two or more processing target layers 102 made of a material (to be described below) are laminated on the substrate 101. Further, for example, the workpiece may have a structure in which no hard mask layer 103 is formed. The structure in which no hard mask layer 103 is formed will be described below in a second exemplary embodiment.

As a material for the processing target layer 102, an anti-reflective coating such as, for example, silicon containing anti-reflective coating (SiARC), a bottom anti-reflective coating (BARC), a spin-on carbon (SOC), or amorphous carbon may be used.

As a material for the hard mask layer 103, for example, a silicon oxide layer or a polysilicon layer may be used.

(Coating Step)

First, as illustrated in FIG. 1A, a photosensitive material 104 is coated on the substrate 101 on which the processing target layer 102 and the hard mask layer 103 are formed. The photosensitive material 104 may include a polarity-changeable resist, since the polarity-changeable resist may be used as a positive-tone resist (a part dissolved where exposed) or a negative-tone resist (a part dissolved where unexposed)

Figure 4:
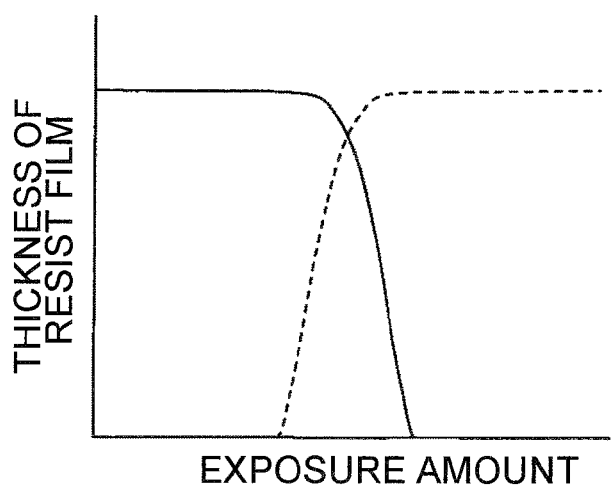
FIG. 4 is an explanatory view of an exemplary characteristic of a resist.

FIG. 4 illustrates an exemplary characteristic of a polarity-changeable resist which may be suitably used in the coating step of the present exemplary embodiment. In FIG. 4, a horizontal axis represents an exposure amount and a vertical axis represents a thickness of a resist layer after development. Further, in FIG. 4, a solid line represents a dissolving characteristic of a resist with respect to a developer for positive-tone development and a broken line represents a dissolving characteristic of a resist with respect to a developer for negative-tone development.

The resist illustrated in FIG. 4 has a positive-tone resist characteristic in that when an exposure amount is small, the resist is sparingly soluble in the developer for positive-tone development, and when the exposure amount is increased, a dissolving rate is increased for the developer for positive-tone development. Further, the resist illustrated in FIG. 4 has a negative-tone resist characteristic in that when an exposure amount is small, the dissolving rate is increased for the developer for negative-tone development, and when the exposure amount is increased, the resist is sparingly soluble in the developer for negative-tone development.

A coating method of the photosensitive material 104 may include a spin coating method which coats the photosensitive material 104 using a coater while rotating the substrate 101 at a high speed.

Meanwhile, before performing the coating step, a surface of the substrate 101 having the processing target layer 102 and the hard mask layer 103 formed thereon may be washed, and baking (pre-coating baking) may be performed in order to increase adhesiveness of the photosensitive material 104 onto the hard mask layer 103.

After the coating step, a solvent remaining in the photosensitive material 104 may be vaporized, and baking (pre exposure baking) may be performed at the same time in order to make the layer precise. The temperature of pre-exposure baking may be, for example, 100° C. to 150° C.

(First Exposing Step)

Figure 1B:
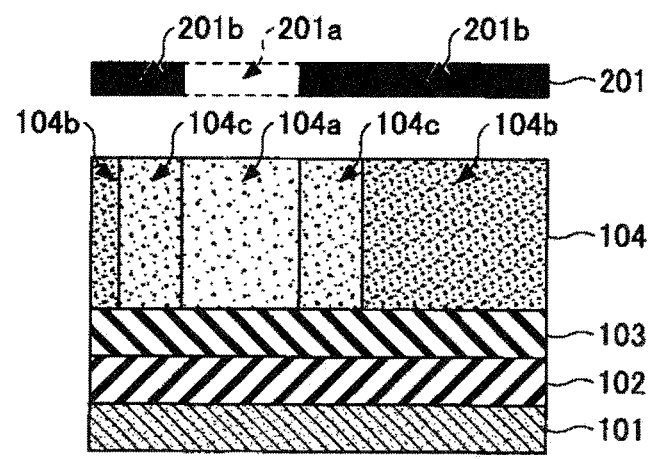

Next, as illustrated in FIG. 1B, the photosensitive material 104 is exposed using a first exposure mask 201. That is, a first pattern is transferred onto the photosensitive material 104 using the first exposure mask 201 having the first pattern.

An ultraviolet light source is appropriately used as a light source for exposure in which, for example, ArF excimer laser having a wavelength of 193 nm may be used.

As the first exposure mask 201, a dark field mask (DFM) including an opening 201a and a light shielding unit 201b may be used. The DFM may be a mask in which an overall quartz substrate is covered by the light shielding layer and a design pattern is configured as a light-transmitting opening.

The first pattern is designed in a range which does not exceed a resolution performance of an exposure device.

When the first pattern is exposed to the photosensitive material 104, a lower region of the opening 201a is exposed and an exposed region 104a is formed in the photosensitive material 104. Further, below the light shielding unit 201b, there is a region where the exposure amount is zero or approximately zero (unexposed region 104b). Further, an intermediate exposure region 104c having a smaller exposure amount, as compared with the exposed region 104a, is formed in a peripheral region of the exposed region 104a due to wraparound of light from the light source through the opening 201a.

The coating step may include a first aligning step of aligning a position of the workpiece and a position of the first exposure mask 201, based on an alignment (positioning) mark formed on the workpiece, for example, on the processing target layer 102, before exposing the first pattern to the photosensitive material 104. Therefore, the position of the workpiece and the position of the first exposure mask 201 may be precisely matched.

The alignment mark is, for example, a square or rectangular mark formed on the workpiece. Further, predetermined positions on the outer circumference of the workpiece such as, for example, four corners or sides of the workpiece may be used as the alignment mark for positioning.

Meanwhile, after the first exposing step, baking (post exposure baking) may be performed. The temperature of post exposure baking may be, for example, 100° C. to 150° C.

(First Developing Step)

Figure 1C:
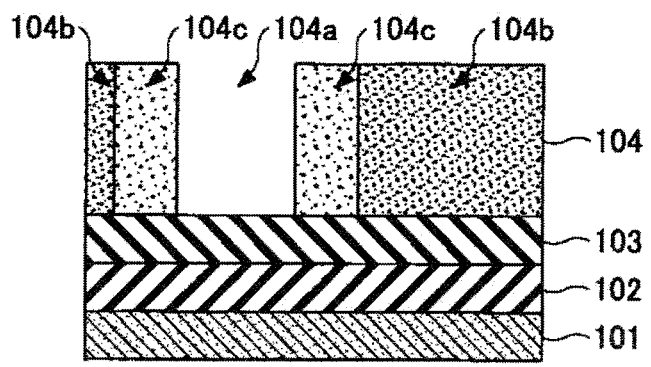

Next, as illustrated in FIG. 1C, a positive-tone development is performed on the photosensitive material 104 using a first developer. That is, the first developer is uniformly coated on the photosensitive material 104 to form the first pattern thereon, which has been transferred during the first exposing step.

As the first developer, an alkali developer such as, for example, tetramethylammonium hydroxide (TMAH) may be used.

Figure 5A:
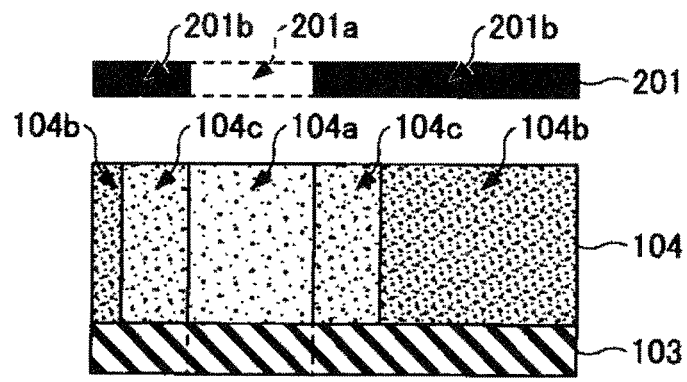
FIGS. 5A to 5C are explanatory views illustrating an effect of the semiconductor device manufacturing method according to the first exemplary embodiment.
Figure 5B:
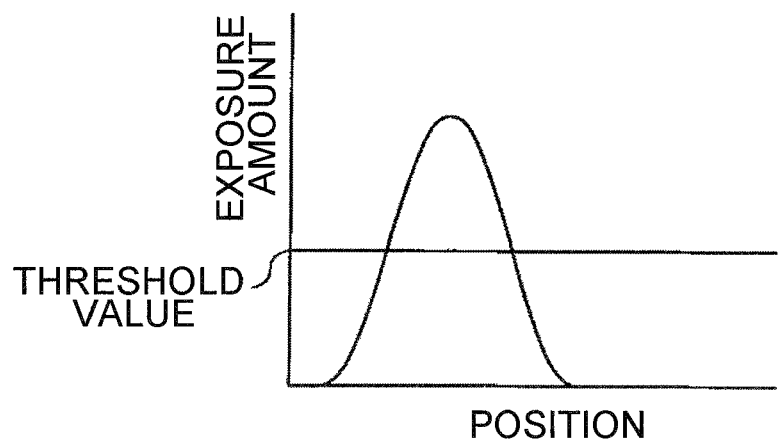
Figure 5C:
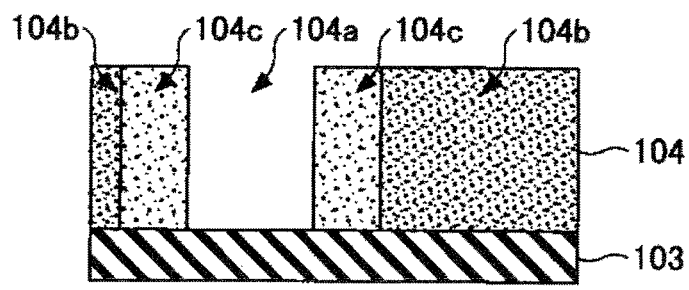

FIGS. 5A to 5C illustrate cross-sectional views and a characteristic chart of the semiconductor device in the first exposing step and the first developing step. FIG. 5A is a cross-sectional view of the semiconductor device when the photosensitive material 104 is exposed, FIG. 5B illustrates an exemplary of an exposure amount distribution, and FIG. 5C is a cross-sectional view of the semiconductor device when the photosensitive material 104 is developed.

As illustrated in FIG. 5A, since the positive-tone development is performed in the first developing step, only an exposed region 104a corresponding to the opening 201a where the exposure amount is equal to or larger than a predetermined threshold value is dissolved. Meanwhile, the unexposed region 104b corresponding to the light shielding unit 201b where the exposure amount is zero or approximately zero remains without being dissolved.

The intermediate exposed region 104c which is a peripheral region of the opening 201a is exposed due to wraparound of light from the light source, but the exposure amount thereof is equal to or slightly larger than zero and smaller than the predetermined threshold value. Therefore, the intermediate exposed region 104c remains without being dissolved. As a result, as illustrated in FIG. 5C, the exposed region 104a is removed and the unexposed region 104b and the intermediate exposed region 104c remain without being dissolved.

Meanwhile, in the first developing step, rinse may be performed using pure water after the development.

(Second Exposing Step)

Figure 2A:
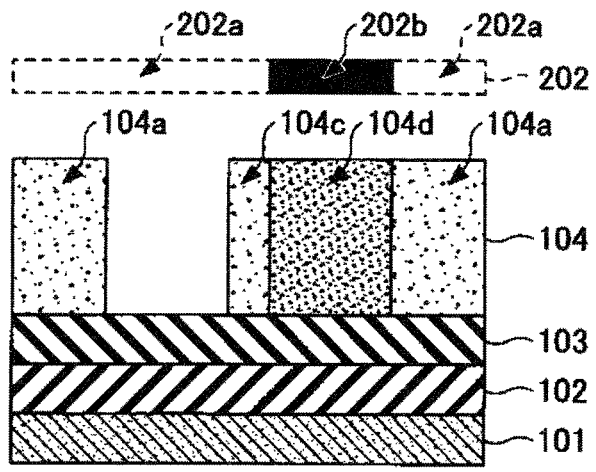
FIGS. 2A to 2C are cross-sectional views illustrating steps of the exemplary semiconductor device manufacturing method according to the first exemplary embodiment.

Next, as illustrated in FIG. 2A, the photosensitive material 104 is exposed using a second exposure mask 202. That is, in the intermediate exposed region 104c which was exposed during the first exposing step but has not been developed, a region where it is desirable to leave the processing target layer 102 is further exposed using a second exposure mask 202 having a second pattern. Accordingly, the intermediate exposed region 104c becomes insoluble in the second developer.

A light source which is the same as that in the first exposing step may be used as the light source for the exposure.

As the second exposure mask 202, a bright field mask (BFM) in which an opening 202a and a light shielding unit 202b are formed may be used. The BFM may be a mask in which a design pattern formed of a light shielding layer is formed on a quartz substrate.

Similarly to the first pattern, the second pattern is designed not to exceed a resolution performance of an exposure device.

When the first exposure mask 201 and the second exposure mask 202 are superimposed one on another, the opening 201a formed on the first exposure mask 201 and the light shielding portion 202b formed on the second exposure mask 202 may be spaced apart from each other in different positions when viewed from the top.

Figure 6A:
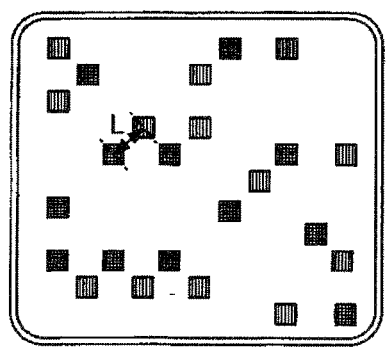
FIGS. 6A to 6C are explanatory views illustrating exemplary patterns of exposure masks used for the semiconductor device manufacturing method according to the first exemplary embodiment.
Figure 6B:
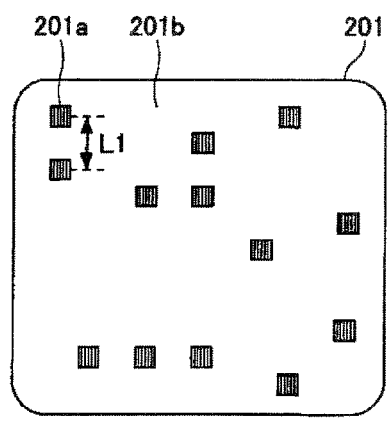
Figure 6C:
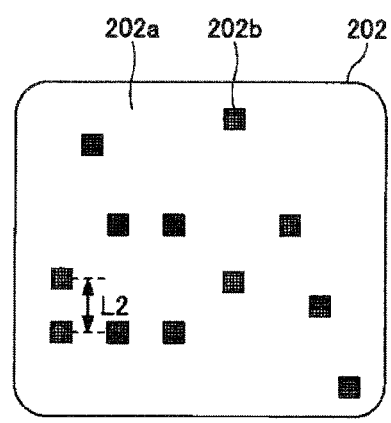

FIGS. 6A to 6C illustrate exemplary patterns of exposure masks for use in a semiconductor device manufacturing method according to an exemplary embodiment.

FIG. 6A is an exemplary desired pattern. In FIG. 6A, a portion entirely filled with vertical lines and a portion entirely filled with lattices are portions corresponding to regions to be dissolved by the development when the pattern is transferred onto the photosensitive material 104. Here, when the exposing step is performed using a DFM having both the portion entirely filled with vertical lines and the portion entirely filled with lattices as openings and then the positive-tone developing step is performed, a desired pattern may not be obtained due to a proximity effect by interference of light which passes through each of the openings if a distance L between centers of adjacent openings is small.

Therefore, in the first exemplary embodiment, for example, the desired pattern illustrated in FIG. 6A is divided into a first pattern (openings 201a and a light shielding part 201b formed on a first exposure mask 201) illustrated in FIG. 6B and a second pattern (an opening 202a and light shielding parts 202*b* formed on a second exposure mask 202) illustrated in FIG. 6C. Further, the first pattern and the second pattern are combined to form one desired pattern.

The first pattern and the second pattern are designed such that the distance L1 between the openings in the first pattern and the distance L2 between the light shielding parts in the second pattern do not exceed the resolution performance of the exposure device.

As described above, when the desired pattern is divided into the first pattern and the second pattern, a desired fine pattern exceeding the resolution performance of the exposure device may be obtained even if the patterns are formed within the range of resolution performance of the exposure device. For example, when a hole pattern is formed by ArF immersion exposure, a pattern in which a distance between centers of adjacent holes (developed regions) is below 76 nm may be obtained.

Meanwhile, even though the example of FIGS. 6A to 6C illustrate hole patterns as an example, the present disclosure is not limited thereto. For example, the present disclosure may use a trench pattern and a line end space pattern.

The mask manufacturing step of manufacturing the first exposure mask 201 having the first pattern and the second exposure mask 202 having the second pattern to form one desired pattern may be performed before the first exposing step.

Here, when the second pattern is exposed to the photosensitive material 104 in which the first pattern is formed, a lower region below the opening 202*a* of the second pattern is exposed to form an exposed region 104*a* in the photosensitive material 104. Further, a region below a light shielding part 202*b* of the second pattern is partially exposed due to wraparound of light from the light source but the exposure amount is below a predetermined threshold value (a negative-tone development dissolved region 104*d*). In this case, the intermediate exposed region 104*c* formed in the first exposing step is further exposed to be insoluble in the developer for negative-tone development.

It is desirable to include a second aligning step of matching the position of the workpiece and the position of the second pattern, based on an alignment (positioning) mark formed on the workpiece, for example, on the processing target layer 102, before exposing the second pattern to the photosensitive material 104. Therefore, the position of the workpiece and the position of the second pattern may be precisely matched.

The alignment mark is, for example, a square or rectangular mark formed on the workpiece. Further, predetermined positions on the outer circumference of the workpiece such as, for example, four corners or sides of the workpiece may be used as the alignment mark for positioning.

Since the first pattern and the second pattern are positioned based on the alignment mark formed on the same workpiece, the first pattern and the second pattern are positioned with especially high precision.

Meanwhile, after the second exposing step, baking (post exposure baking) may be performed. The temperature of post exposure baking may be, for example, 100° C. to 150° C.

(Second Developing Step)

Figure 2B:
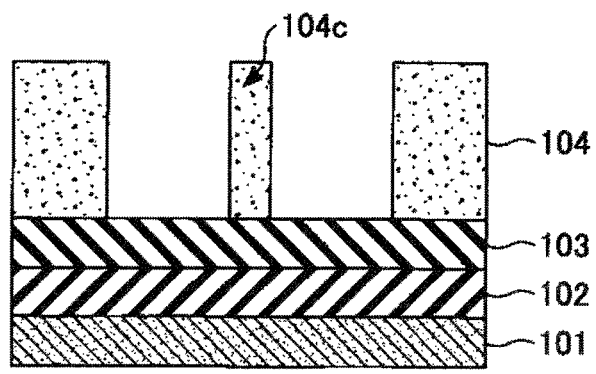

Next, as illustrated in FIG. 2B, a negative-tone development is performed on the photosensitive material 104 using a second developer. That is, the second developer is uniformly coated on the photosensitive material 104 to form the second pattern thereon, which has been transferred during the second exposing step.

As the second developer, an organic solvent such as butyl acetate may be used.

Figure 7A:
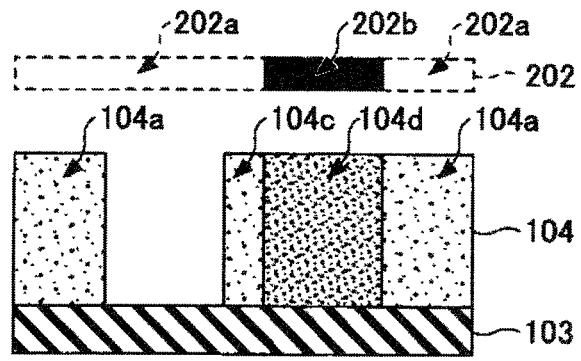
FIGS. 7A to 7C are explanatory views of an effect of the semiconductor device manufacturing method according to the first exemplary embodiment.
Figure 7B:
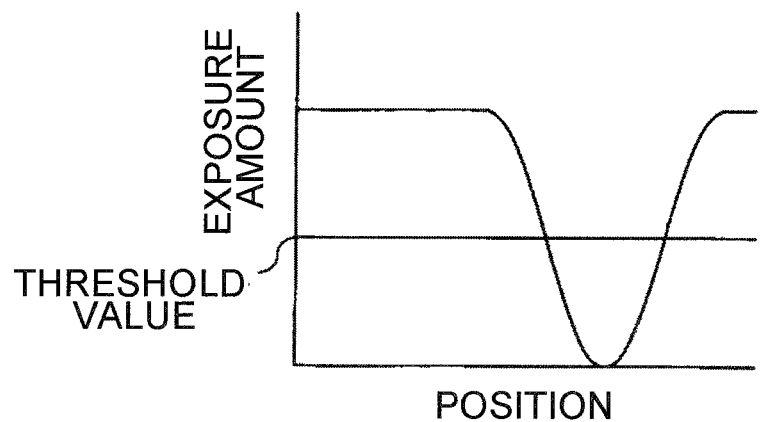
Figure 7C:
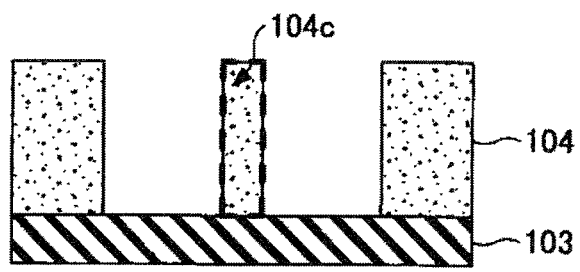
Figure 8A:
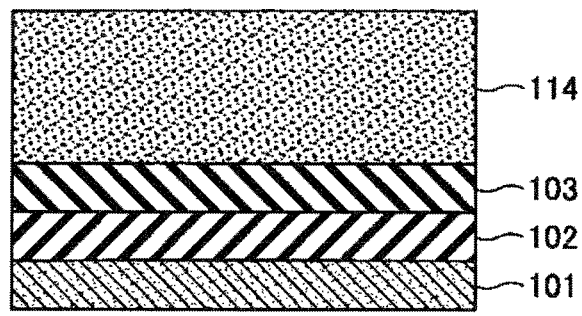
FIGS. 8A to 8C are cross-sectional views illustrating steps of an exemplary semiconductor device manufacturing method in the related art.
Figure 8B:
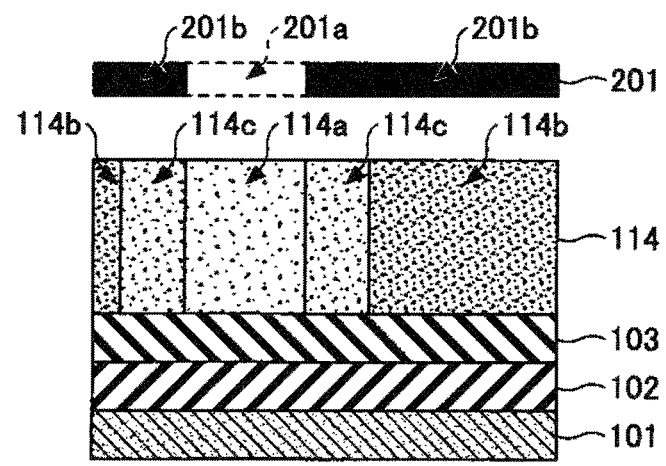
Figure 8C:
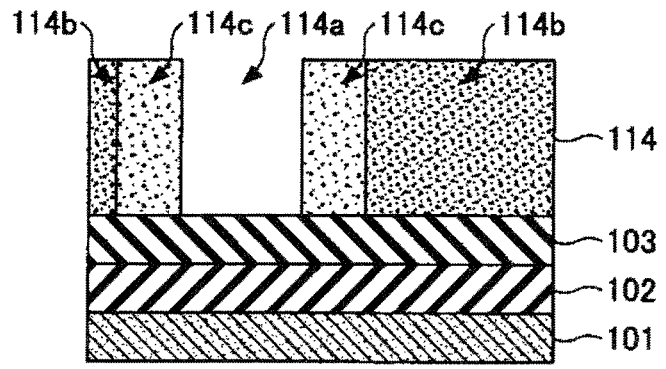

FIGS. 7A to 7C illustrate cross-sectional views and characteristic chart of the semiconductor device in the second exposing step and the second developing step. FIG. 7A is a cross-sectional view illustrating the semiconductor device when the photosensitive material 104 is exposed, FIG. 7B is an exemplary of an exposure amount distribution, and FIG. 7C a cross-sectional view illustrating the semiconductor device when the photosensitive material 104 is developed.

As illustrated in FIG. 7A, since the negative-tone development is performed in the second developing step, only a negative-tone development dissolved region 104*d* corresponding to a light shielding part 202*b* of the second pattern where the exposure amount is equal to or smaller than a predetermined threshold value is dissolved. Meanwhile, an exposed region 104*a* corresponding to the opening 202*a* of the second pattern where the exposure amount is larger than the predetermined threshold value remains without being dissolved.

Since the intermediate exposed region 104*c* is further exposed in the second exposing step as illustrated in FIG. 7B, the intermediate exposed region 104*c* remains without being dissolved in the second developing step as illustrated in FIG. 7C.

Meanwhile, in the second developing step, rinse may be performed after development.

(Etching Step of Hard Mask Layer)

Figure 2C:
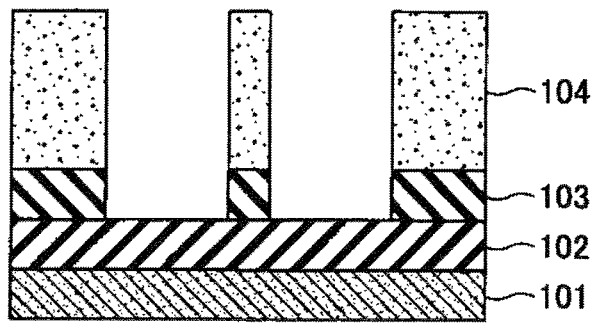

As illustrated in FIG. 2C, the hard mask layer 103 is selectively removed by etching with the patterned photosensitive material 104 as an etching mask.

As an etching method, dry etching such as reactive ion etching (RIE) may be used.

(Removing Step of Photosensitive Material)

Figure 3A:
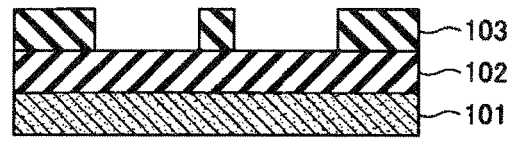
FIGS. 3A to 3C are cross-sectional views illustrating steps of the exemplary semiconductor device manufacturing method according to the first exemplary embodiment.

As illustrated in FIG. 3A, the photosensitive material 104 is removed.

As a removing method, for example, dry etching or wet etching may be used.

(Etching Step of Processing Target Layer)

Figure 3B:
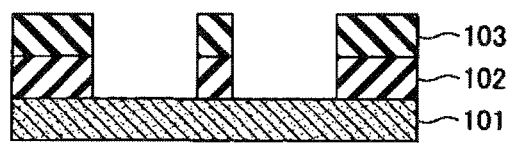

As illustrated in FIG. 3B, the processing target layer 102 is selectively removed by etching with the patterned hard mask layer 103 as an etching mask.

As an etching method, for example, dry etching such as RIE may be used.

(Removing Step of Hard Mask Layer)

Figure 3C:
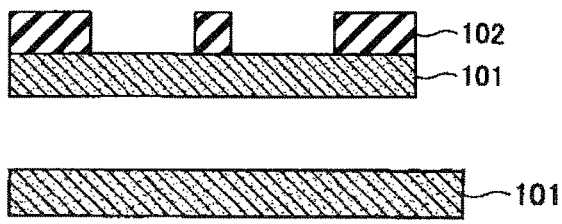

As illustrated in FIG. 3C, the hard mask layer 103 is removed.

As a removing method, for example, dry etching or wet etching may be used.

A desired fine pattern may be formed by the above-described steps.

Next, in order to compare steps of a semiconductor device manufacturing method, a method of forming a desired fine pattern by an LELE method will be described with reference to FIGS. 8A to 11C.

The LELE method alternately repeats a lithography step for forming a pattern by a coating step, an exposing step, and a developing step, and an etching step for performing etching based on the pattern obtained in the lithography step.

Figure 11A:
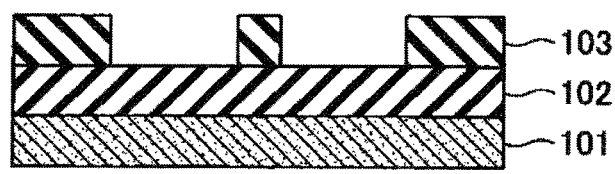
FIGS. 11A to 11C are cross-sectional views illustrating steps of the exemplary semiconductor device manufacturing method in the related art.
Figure 11B:
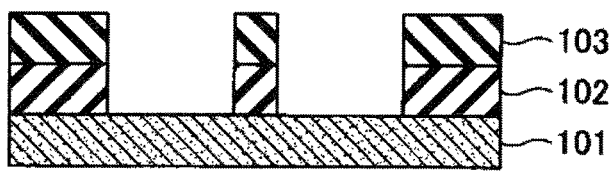
Figure 11C:
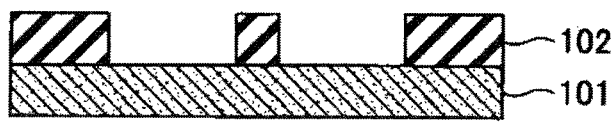

That is, as illustrated in FIGS. 8A to 11C, after performing coating (FIG. 8A), exposure (FIG. 8B), and development (FIG. 8C) as a first lithography step, etching (FIG. 9A) and removing (FIG. 9B) are performed as a first etching step. Next, after performing coating (FIG. 9C), exposure (FIG. 10A), and development (FIG. 10B) as a second lithography step, etching (FIG. 10C) and removing (FIG. 11A) are performed as a second etching step. The processing target layer 102 is selectively removed by etching with a patterned hard mask layer 103 as an etching mask (FIG. 11B) and subsequently, the hard mask layer 103 is removed, thereby forming a desired fine pattern (FIG. 11C).

As described above, when a desired fine pattern is formed by the LELE method, it is necessary to alternately repeat a lithography step for forming a pattern by a coating step, an exposing step, and a developing step, and an etching step for performing etching based on the pattern obtained in the lithography step. Therefore, the number of entire steps is increased, which increases manufacturing costs.

Figure 9A:
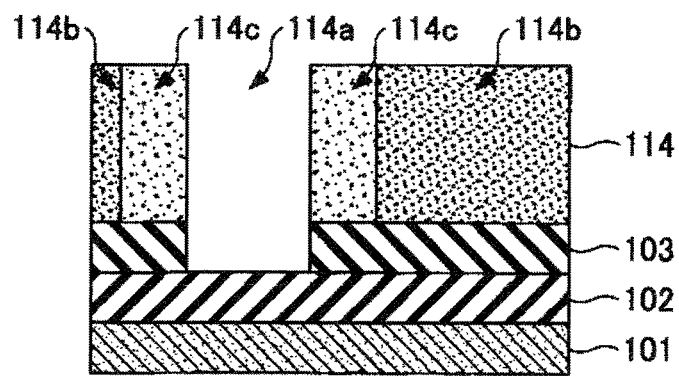
FIGS. 9A to 9C are cross-sectional views illustrating steps of the exemplary semiconductor device manufacturing method in the related art.
Figure 9B:
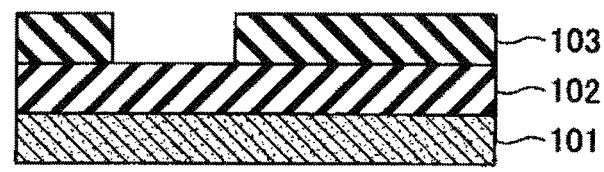
Figure 9C:
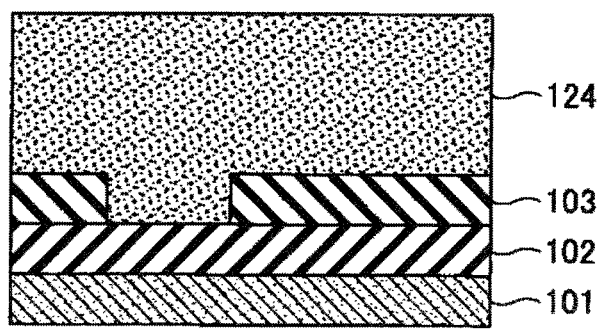
Figure 10A:
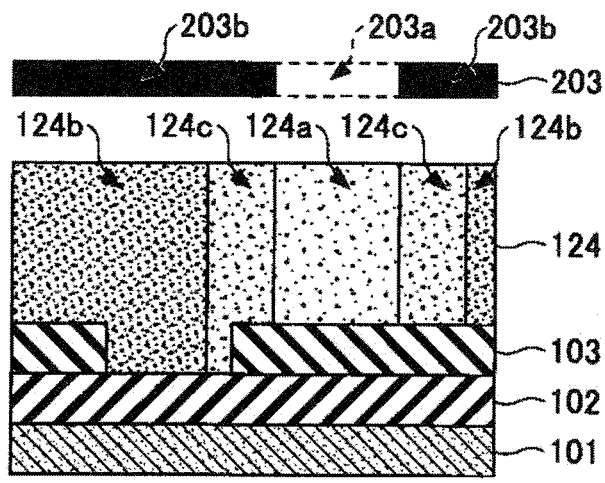
FIGS. 10A to 10C are cross-sectional views illustrating steps of the exemplary semiconductor device manufacturing method in the related art.
Figure 10B:
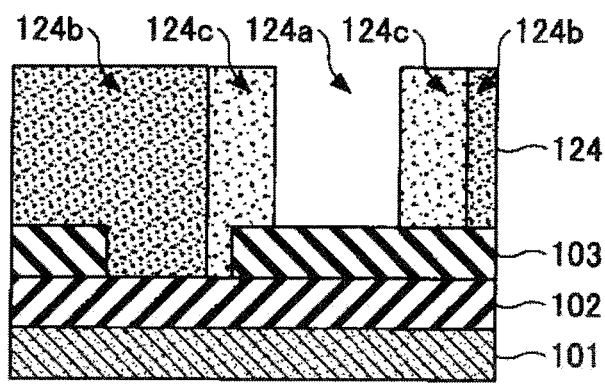
Figure 10C:
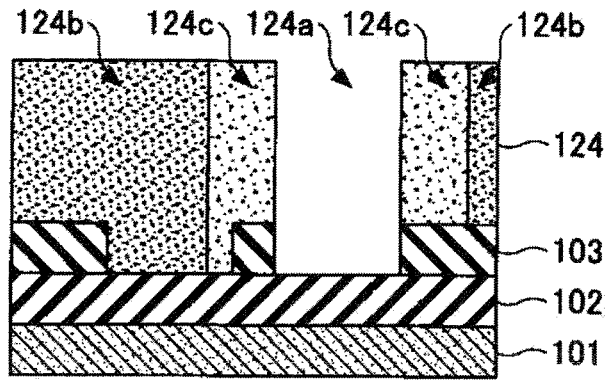

According to the LELE method, as illustrated in FIGS. 9A and 9B, since the photosensitive material 114 needs to be removed after the first development, the hard mask layer 103 serving as an etching mask of the processing target layer 102 is necessarily required.

As described above, according to the semiconductor device manufacturing method according to the first exemplary embodiment, a desired fine pattern may be obtained with a reduced number of steps as compared with the LELE process.

Second Exemplary Embodiment

Next, an exemplary semiconductor device manufacturing method according to a second exemplary embodiment of the present disclosure will be described with reference to FIGS. 12A to 12C and 13A to 13D. Meanwhile, in the second exemplary embodiment, components having the substantially same functional configurations as those of the first exemplary embodiment will be denoted by the same reference numerals and a redundant description thereof will be omitted.

FIGS. 12A to 12C and 13A to 13D illustrate cross-sectional views of an exemplary semiconductor device manufacturing method according to the second exemplary embodiment. As illustrated in FIGS. 12A to 12C and 13A to 13D, the semiconductor device manufacturing method according to the second exemplary embodiment is different from that of the first exemplary embodiment in that a photosensitive material 104 is formed on a substrate 101 without forming a hard mask layer 103.

Figure 12A:
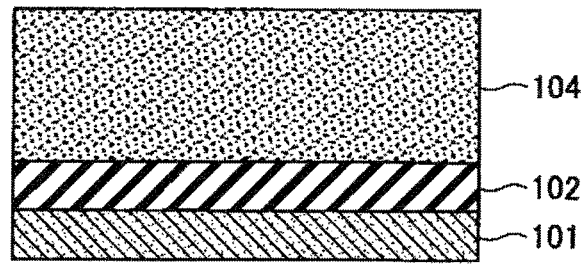
FIGS. 12A to 12C are cross-sectional views illustrating steps of an exemplary semiconductor device manufacturing method according to a second exemplary embodiment.
Figure 12B:
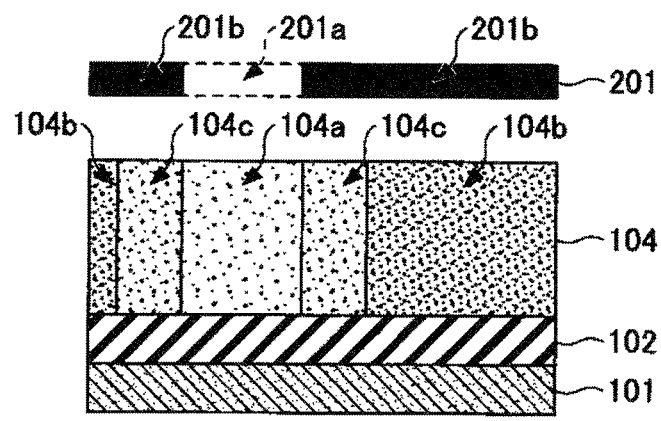
Figure 12C:
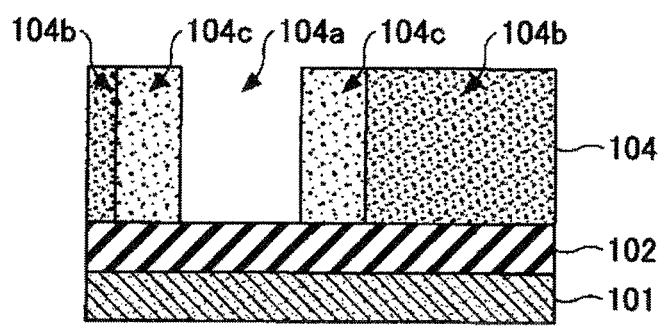

In the semiconductor device manufacturing method according to the second exemplary embodiment, first, as illustrated in FIG. 12A, the photosensitive material 104 is coated on a workpiece (a coating step). Next, as illustrated in FIG. 2B, the photosensitive material 104 is exposed using a first exposure mask 201 (a first exposing step). Next, as illustrated in FIG. 12C, a positive-tone development is performed on the photosensitive material 104 using a first developer (a first developing step).

Figure 13A:
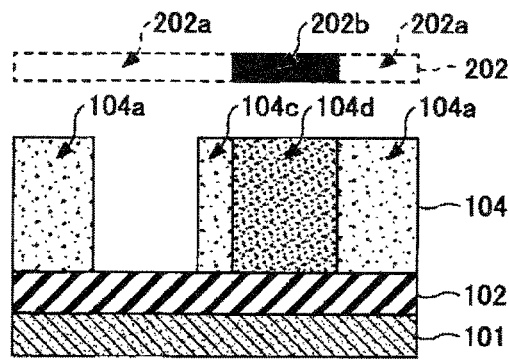
FIGS. 13A to 13D are cross-sectional views illustrating steps of the semiconductor device manufacturing method according to the second exemplary embodiment.
Figure 13B:
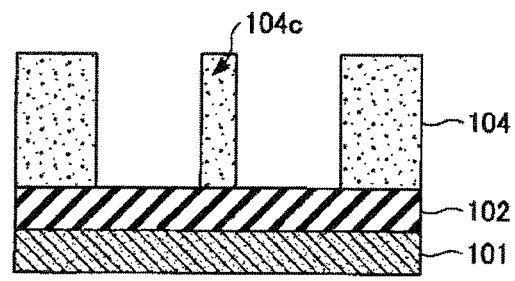

Next, as illustrated in FIG. 13A, the photosensitive material 104 is exposed using a second exposure mask 202 (a second exposing step). Next, as illustrated in FIG. 13B, a negative-tone development is performed on the photosensitive material 104 using a second developer (a second developing step).

Figure 13C:
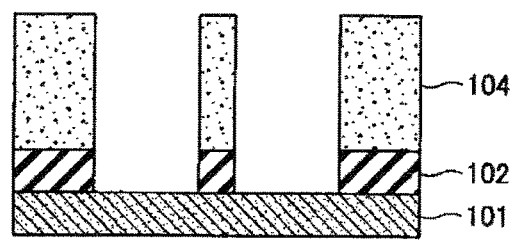
Figure 13D:

Next, as illustrated in FIG. 13C, the processing target layer 102 is selectively removed by etching with the patterned photosensitive material 104 as an etching mask (the etching step of the processing target layer). Finally, as illustrated in FIG. 13D, the photosensitive material 104 is removed (the removing step of the photosensitive material).

As described above, in the semiconductor device manufacturing method according to the second exemplary embodiment, since the hard mask layer 103 is not formed, the etching step of the hard mask layer 103 (FIG. 2C) and the removing step of the hard mask layer 103 (FIG. 3C) in the first exemplary embodiment do not need to be performed.

Accordingly, the number of steps in the semiconductor device manufacturing method may be further reduced.

As described above, according to the semiconductor device manufacturing method according to the second exemplary embodiment, a desired fine pattern may be obtained with a reduced number of steps as compared with the LELE process.

Specifically, in the second exemplary embodiment, since the processing target layer 102 is formed on the substrate 101 without forming the hard mask layer 103, there is no need to perform the etching step of the hard mask layer 103 or the removing step of the hard mask layer 103. As a result, a desired fine pattern may be obtained with a reduced number of steps.

[Configuration of Semiconductor Manufacturing Apparatus]

Next, a coating and developing apparatus as an example of a semiconductor manufacturing apparatus which is appropriately used for the semiconductor device manufacturing method of the present disclosure will be described with reference to FIGS. 14 to 16. In the following description, descriptions will be made using a third block B3 as an example of a photosensitive material coating unit, an exposure device ST4 as an example of a first exposing unit and a second exposing unit, a first block B1 as an example of a first developing unit and a second developing unit, a conveying arm A1, a conveying arm A2, and a conveying arm A3, a delivery unit C, a delivery arm D, a shuttle arm E, and an interface arm F as an example of a conveying device which carries in and out an workpiece.

Figure 14:
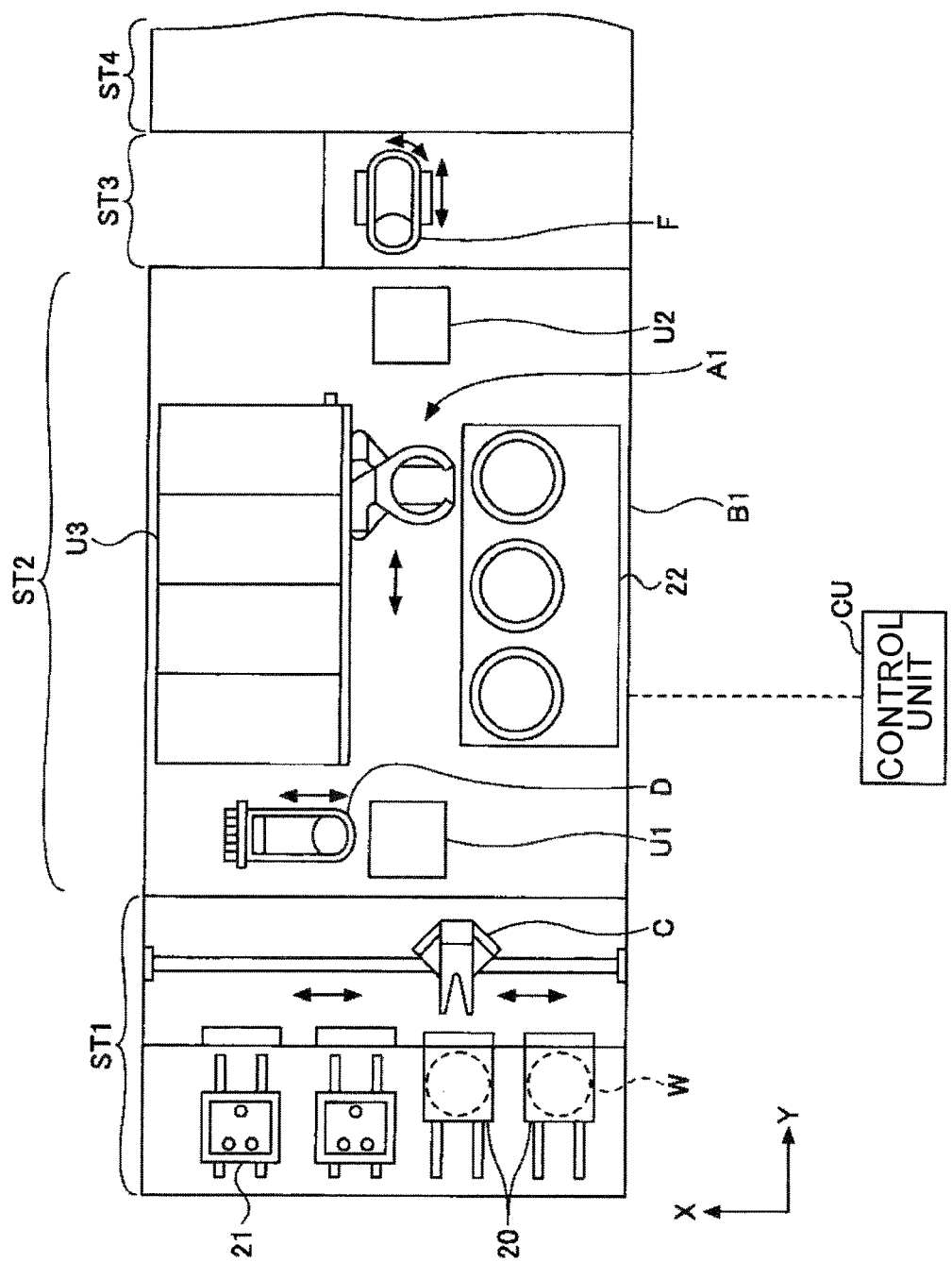
FIG. 14 is a plan view illustrating a schematic configuration of a coating and developing apparatus according to an exemplary embodiment.
Figure 15:
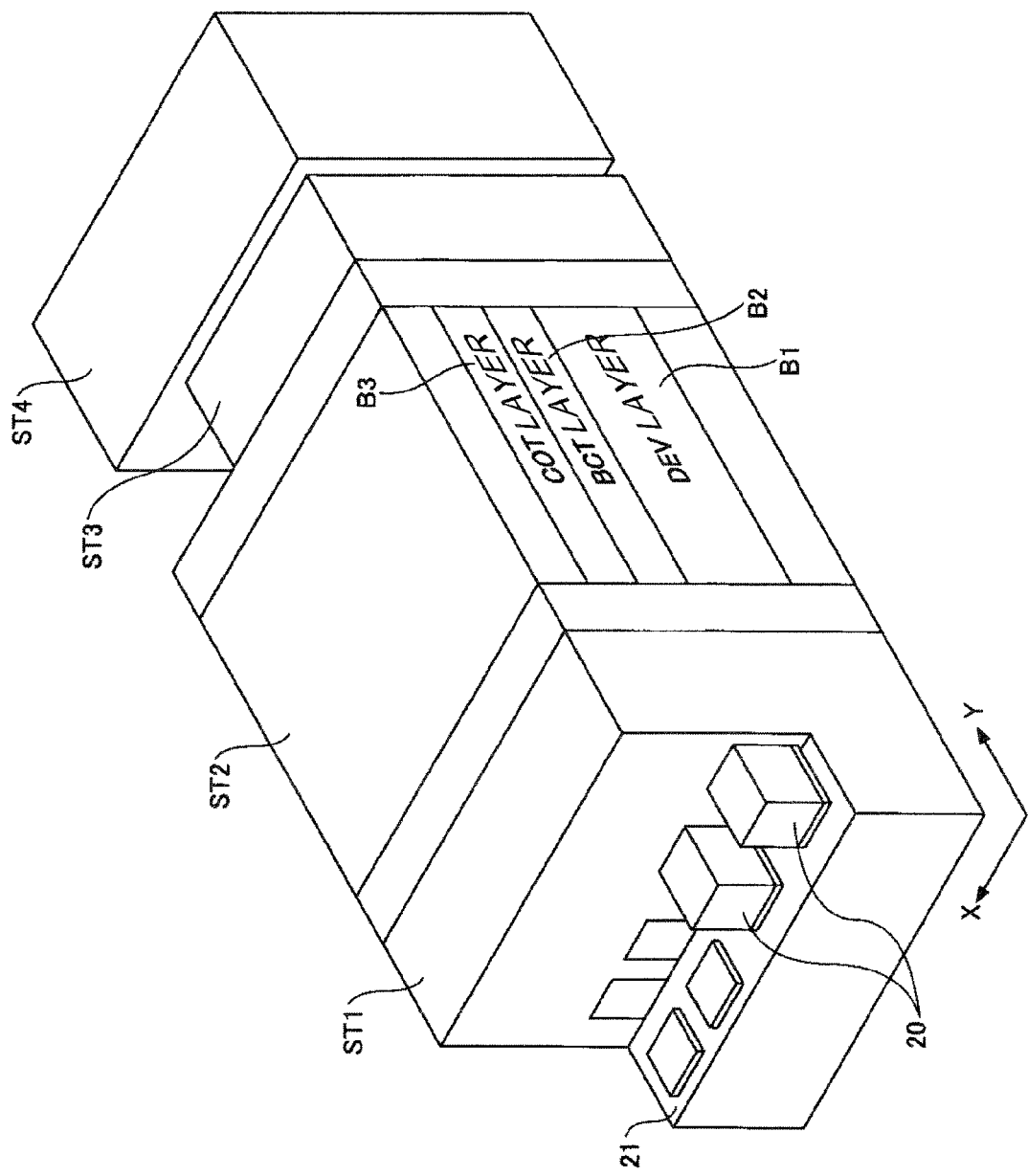
FIG. 15 is a perspective view illustrating a schematic configuration of the coating and developing apparatus of FIG. 14.
Figure 16:
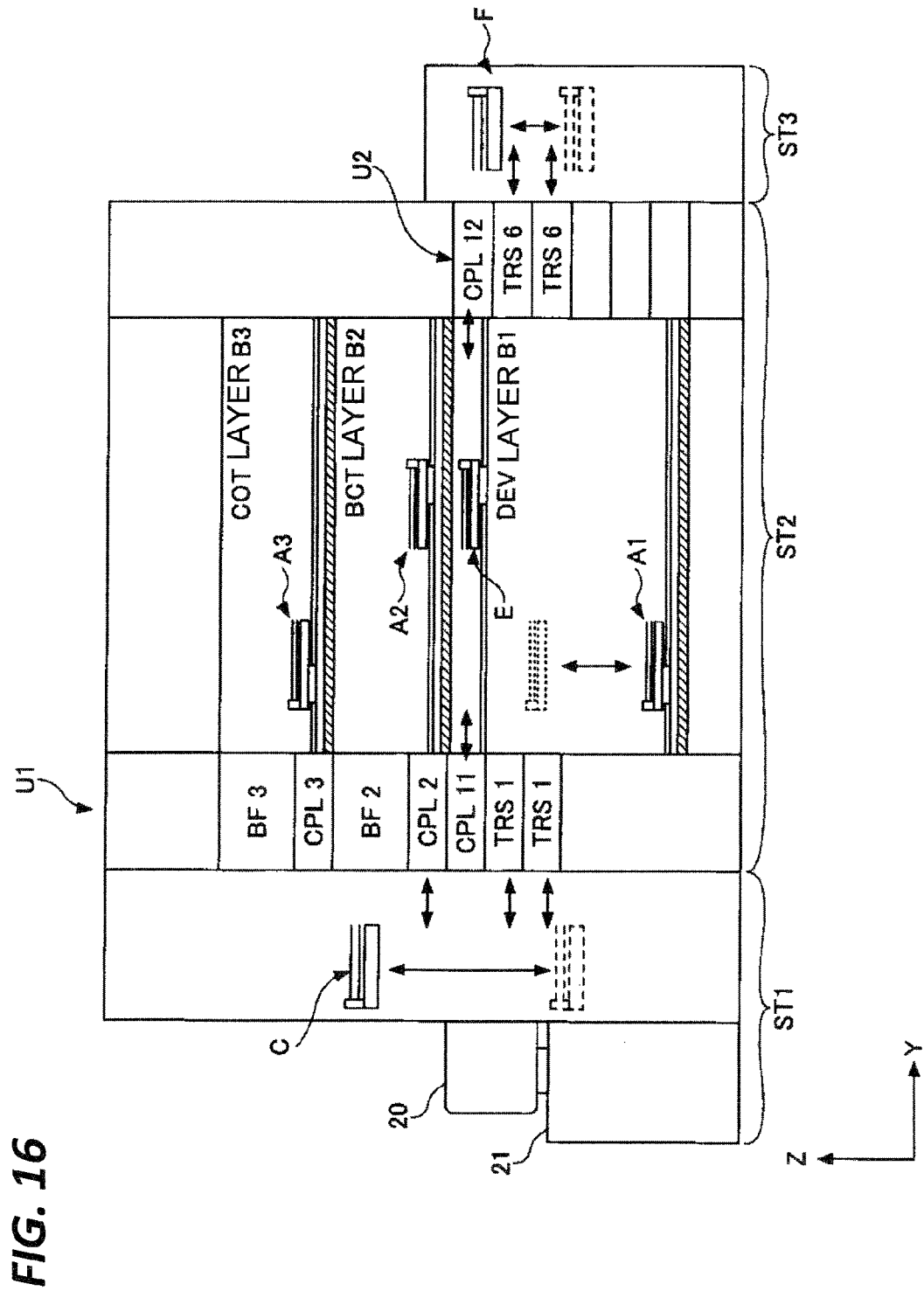
FIG. 16 is a side view illustrating a schematic configuration of the coating and developing apparatus of FIG. 14.

FIGS. 14, 15, and 16 illustrate a plan view, a perspective view, and a side view of an exemplary schematic structure of a coating and developing apparatus, respectively.

As illustrated in FIGS. 14 and 15, the coating and developing apparatus according to the present exemplary embodiment includes a carrier block ST1, a processing block ST2, and an interface block ST3. Further, an exposure device ST4 is provided at the interface block ST3 side of the coating and developing apparatus. The processing block ST2 is provided adjacent to the carrier block ST1. The interface block ST3 is provided adjacent to the processing block ST2 at a side of the processing block ST2 opposite to the carrier block ST1 side. The exposure device ST4 is provided adjacent to the interface block ST3 at a side of the interface block ST3 opposite to the processing block ST2 side.

An operation of the coating and developing apparatus according to the present exemplary embodiment is controlled by a control unit CU.

The carrier block ST1 includes a carrier 20, a placing table 21, and a delivery unit C. The carrier 20 is placed on the placing table 21. The delivery unit C removes a wafer W from the carrier 20, delivers (carries in) to the processing block ST2. The delivery unit C receives the processed wafer W processed in the processing block ST2, and returns (carries out) the wafer W to the carrier 20.

As illustrated in FIGS. 14 and 15, the processing block ST2 includes a shelf unit U1, a shelf unit U2, a first block (a DEV layer) B1, a second block (a BCT layer) B2, and a third block (a COT layer) B3. In the first block B1, a developing step is performed. In the second block B2, an antireflective layer is formed below a resist layer. In the third block, a resist solution is coated on the antireflective layer to form a resist layer.

The shelf unit U1 is configured by stacking various modules one on another. As illustrated in FIG. 16, the shelf unit U1 includes delivery modules TRS1, TRS1, CPL11, CPL2, BF2, CPL3, and BF3 which are sequentially stacked from the bottom. Further, as illustrated in FIG. 14, in the vicinity of the shelf unit U1, a liftable delivery arm D is provided. The wafer W is conveyed between modules of the shelf unit U1 by the delivery arm D.

The shelf unit U2 is configured by staking various modules one on another. As illustrated in FIG. 16, the shelf unit U2 includes delivery modules TRS6, TRS6, and CPL12 which are sequentially stacked from the bottom.

Meanwhile, in FIG. 16, a delivery module denoted by "CPL" also serves as a cooling module for adjusting a temperature and a delivery module denoted by "BF" also serves as a buffer module on which a plurality of wafers W may be disposed.

As illustrated in FIGS. 14 and 16, the first block B1 includes developing modules 22, a heating and cooling module U3, a conveying arm A1, and a shuttle arm E. The developing modules 22 are stacked vertically in two tiers in one first block B1. The heating and cooling module U3 performs a pre-processing (for example, post exposure baking) and a post-processing for a processing performed in the developing modules 22. The conveying arm A1 conveys the wafers W to the two-tiered developing modules 22 and the heating and cooling module U3. That is, the conveying arm A1 is shared by the two-tiered developing modules 22 and the heating and cooling module U3, as conveying arm which conveys the wafers W. The shuttle arm E directly conveys the wafers W from the delivery module CPL11 of the shelf unit U1 to the delivery module CPL12 of the shelf unit U2.

Each of the second block B2 and the third block B3 includes a coating module, the heating and cooling module U3, and the conveying arm A2 or A3. The heating and cooling module U3 performs a pre-processing and a post-processing for a processing performed in the coating module. The conveying arms A2 and A3 are provided between the coating module and the heating and cooling module U3 and deliver the wafers W between the coating module and the heating and cooling module U3.

The second block B2 and the third block B3 have the same configuration, except that a chemical liquid in the second block B2 is a chemical liquid for an antireflective layer and a chemical liquid in the third block B3 is a resist solution.

The interface block ST3 has an interface arm F, as illustrated in FIG. 14. The interface arm F is provided in the vicinity of the shelf unit U2 of the processing block ST2. The interface arm F conveys the wafers W between the modules of the shelf unit U2 and between the shelf unit U2 and the exposure device ST4.

Next, an exemplary operation of the coating and developing apparatus will be described. Meanwhile, the following operations are controlled by a control unit CU.

First, the wafers W are sequentially conveyed from the carrier block ST1 to one delivery module of the shelf unit U1, for example, the delivery module CPL2 corresponding to the second module B2, by the delivery unit C. The wafers W conveyed to the delivery module CPL2 are delivered to the conveying arm A2 of the second block B2, and conveyed to individual processing modules of the second block B2 through the conveying arm A2 so that corresponding processings are performed in the individual processing modules, respectively. Accordingly, the antireflective layer is formed on the wafers W.

The wafers W coated with the antireflective layer is delivered to the conveying arm A3 of the third block B3, through the conveying arm A2, the delivery module BF2 of the shelf unit U1, the delivery arm D, and the delivery module CPL3 of the shelf unit U1. The wafers W are conveyed to the individual processing modules of the third block B3 through the conveying arm A3 and the corresponding processings are performed in the individual processing modules. Accordingly, a resist layer is formed on the wafers W (a coating step).

The wafers W coated with the resist layer are delivered to the shuttle arm E of the first block B1 through the conveying arm A3, the delivery module BF3 of the shelf unit U1, the delivery arm D, and the delivery module CPL11 of the shelf unit U1. The wafers W are directly conveyed to the delivery module CPL12 of the shelf unit U2 by the shuttle arm E and then delivered to the interface arm F of the interface block ST3. The wafer W delivered to the interface arm F is conveyed to the exposure device ST4 and a predetermined exposure processing (a first exposing step) is performed.

The wafers W subjected to the predetermined exposure processing are disposed in the delivery module TRS6 of the shelf unit U2 through the interface arm F and returned to the processing block ST2. The wafers W returned to the processing block ST2 are conveyed to the individual processing modules through the conveying arm A1 in the first block B1, and a development processing (a first developing step) is performed.

The wafers W subjected to the development processing are delivered to the shuttle arm E of the first block B1, through the conveying arm A1, the delivery module TRS1 of the shelf unit U1, the delivery arm D, and the delivery module CPL11 of the shelf unit U1. The wafers W are directly conveyed to the delivery module CPL12 of the shelf unit U2 by the shuttle arm E and then delivered to the interface arm F of the interface block ST3. The wafer W delivered to the interface arm F is conveyed to the exposure device ST4 and a predetermined exposure processing (a second exposing step).

The wafers W subjected to the predetermined exposure processing are disposed in the delivery module TRS6 of the shelf unit U2 through the interface arm F and returned to the processing block ST2. The wafers W returned to the processing block ST2 are conveyed to the individual processing modules through the conveying arm A1 in the first block B1, and a development processing (a second developing step) is performed.

The wafers W subjected to the development processing are returned to the carrier 20 through the conveying arm A1, the delivery module TRS1 of the shelf unit U1, and the delivery unit C.

The wafers W returned to the carrier 20 are conveyed from the coating and developing apparatus to the outside by a conveying unit (not illustrated) and the antireflective layer is etched with the resist layer as an etching mask by an etching apparatus such as an RIE apparatus to have a desired pattern.

Finally, the wafers W having a desired pattern obtained by etching the antireflective layer are conveyed from the etching apparatus to a resist removing apparatus by a conveying unit (not illustrated) to remove the resist layer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of manufacturing a semiconductor device, the method comprising:
   forming a first exposure mask of a first pattern and a second exposure mask of a second pattern;
   coating a photosensitive material on a workpiece;
   a first exposing step including exposing the photosensitive material using the first exposure mask;
   a first developing step including performing a positive-tone development on the photosensitive material using a first developer after the first exposing step;
   a second exposing step including exposing the photosensitive material using the second exposure mask after the first developing step; and
   a second developing step including performing a negative-tone development on the photosensitive material using a second developer after the second exposing step, wherein
   the forming includes forming the first exposure mask and the second exposure mask in a manner that, when the first exposure mask and the second exposure mask are superimposed, a light transmitting portion of the first exposure mask and a light shielding portion of the second exposure mask are free of being overlapped with each other, and
   the light transmitting portion of the first exposure mask and the light shielding portion of the second exposure mask are configured to allow a part of an intermediate exposed region that is exposed at the first exposing but not developed at the first developing to be developed at the second developing.

2. The method of claim 1, wherein the first exposing step includes aligning a position of the workpiece and a position of the first exposure mask based on an alignment mark formed on the workpiece, and
   the second exposing step includes aligning a position of the workpiece and a position of the second exposure mask based on the alignment mark formed on the workpiece.

3. The method of claim 1, wherein a pattern formed by the method includes a hole pattern or a trench pattern.

4. The method of claim 1, wherein the photosensitive material includes a polarity-changeable resist.

5. The method of claim 1, wherein a developed region formed by the method includes a portion where a distance between centers of adjacent developed regions is less than 76 nm.

6. The method of claim 1, wherein the forming further includes dividing a target pattern to be formed on the workpiece into the first pattern and the second pattern in a manner that combining the first pattern and the second pattern defines the target pattern.

7. The method of claim 1, wherein
   the first exposure mask is a dark field mask with the light transmitting portion defining the first pattern, and
   the second exposure mask is a bright field mask with the light shielding portion defining the second pattern.

* * * * *